United States Patent [19]

Shibano

[11] Patent Number: 4,531,092
[45] Date of Patent: Jul. 23, 1985

[54] OPTOELECTRONIC SYSTEM FOR MEASURING ELECTRIC OR MAGNETIC QUANTITIES UTILIZING A DUAL LIGHT BEAM OF DIFFERENT WAVELENGTHS

[75] Inventor: Fumehiko Shibano, Ome, Japan

[73] Assignee: Iwatsu Electric Co., Ltd., Tokyo, Japan

[21] Appl. No.: 377,583

[22] Filed: May 12, 1982

[30] Foreign Application Priority Data

May 28, 1981 [JP] Japan ................. 56-81988

[51] Int. Cl.³ .............. G01R 33/032; G01R 29/12
[52] U.S. Cl. ..................... 324/244; 324/96; 350/408
[58] Field of Search ............ 324/244, 246, 249, 250, 324/96, 117; 350/315-378, 408; 356/356; 372/105

[56] References Cited

U.S. PATENT DOCUMENTS

| | | | |
|---|---|---|---|
| 3,621,390 | 11/1971 | Von Willisen | 324/96 |
| 3,663,087 | 5/1972 | Guillet et al. | 350/376 X |
| 3,891,321 | 6/1975 | Hock | 356/356 |
| 3,963,995 | 6/1976 | Jacob | 350/375 X |
| 4,222,668 | 9/1980 | Henry | 350/377 X |
| 4,269,483 | 5/1981 | Feldtkeller | 324/96 X |
| 4,276,519 | 6/1981 | Marteau | 372/105 X |
| 4,370,612 | 1/1983 | Puech et al. | 324/96 X |
| 4,375,910 | 5/1983 | Seki | 350/375 |

FOREIGN PATENT DOCUMENTS

118675 9/1981 Japan.

Primary Examiner—Gerard R. Strecker
Assistant Examiner—Warren S. Edmonds
Attorney, Agent, or Firm—Woodcock Washburn Kurtz Mackiewicz & Norris

[57] ABSTRACT

A method and system for measuring quantities of electricity or magnetism by use of two light beams of different wavelengths and prescribed relative intensities. Emitted by respective light sources, the two beams are combined as by an interference filter to travel through a common optical fiber to a modulator station, where the beams are first plane polarized. The plane-polarized beams enter an optical modulator, therein to be modulated by the Pockels or Faraday effect in accordance with an electric or magnetic quantity to be measured. Then, after passing a quarter-wave plate as required, the modulated beams fall on a wavelength-dependent, selective polarizing filter, which polarizes only one of the incident beams into an intensity-modulated beam and which passes the other as a non-intensity-modulated beam. The beams are again sent over a common optical fiber to a beam splitter, which separates the beams from each other. Placed after the beam splitter, two photodetectors sense the intensities of the separated intensity- and non-intensity-modulated beams respectively. The electric or magnetic quantity is calculated, as by a digital computer, from the relative intensities of the intensity- and non-intensity-modulated beams falling on the photodetectors and the relative intensities of the beams as emitted by the light sources.

17 Claims, 7 Drawing Figures

OPTOELECTRONIC SYSTEM FOR MEASURING ELECTRIC OR MAGNETIC QUANTITIES UTILIZING A DUAL LIGHT BEAM OF DIFFERENT WAVELENGTHS

BACKGROUND OF THE INVENTION

My invention pertains to a method of, and a system for, optoelectronically measuring quantities of electricity or magnetism by use of two beams of light of different wavelengths. The opto-electronic measuring method and system of this invention have particular utility as under circumstances where electromagnetic disturbances preclude the use of more common electrical measuring instruments or where the use of potential generators involves danger.

The invention deals more specifically with improvements in optoelectronic measuring systems of the type described and claimed in Japanese Patent Application No. 55-22449, filed by the assignee of the instant application. I will incorporate the contents of this prior Japanese application herein insofar as is necessary for a full understanding of my present invention.

Two well known methods exist for optoelectronic measurement of quantities of electricity or magnetism. One takes advantage of the electrooptical Pockels effect for measurement of voltages or electric charges. The other utilizes the magnetooptical Faraday effect for determination of current magnitudes or magnetic field strengths.

For the measurement of voltages or charges by the Pockels effect, light is directed into a Pockels crystal such as potassium dihydrogen phosphate (KDP) or lithium niobate (LiNbO$_3$). The incident light gives rise to two characteristically polarized components, which propagate through and emerge from the Pockels crystal with a phase difference therebetween proportional to the strength of the electric field being impressed to the crystal. The two polarized beam components are subsequently passed through a polarizing filter, which selectively absorbs components of the incident light. Coming out of the polarizing filter is a beam having an intensity modulated to represent the phase difference between the two incoming waves. One can know the applied voltage or charge from the intensity of this intensity-modulated beam.

The Faraday effect lends itself to use for the measurement of current magnitudes or magnetic field strengths in the following manner. When a beam of plane-polarized light passes through a Faraday medium in the direction of an applied magnetic field, the plane of polarization rotates through an angle proportional to the field strength. Subsequently passed through a polarizing filter, the polarized beam has its Faraday rotation translated into the intensity of the output beam. The measurement of the intensity of this intensity-modulated beam provides an indication of the current magnitude or magnetic field strength.

These optoelectronic measuring schemes based on the Pockels and Faraday effects have gained greater utility with the recent development and refinement of optical fibers capable of acting as "light pipes" or carriers of optical energy.

In a typical conventional electric or magnetic measuring system; optical fibers find use as transmission lines from a monochromatic light source to an electro- or magnetooptical modulator, where the incoming light is intensity modulated either electrically or magnetically, and from this modulator to a photodetector. The light source usually takes the form of a laser or light-emitting diode (LED). For the measurement of voltages or electric charges the modulator may comprise a polarizer, Pockels or like electrooptical crystal, phase element such as a quarter-wave plate, and polarizing filter. For the measurement of current magnitudes or magnetic field strengths, on the other hand, the modulator may comprise a polarizer, Faraday or other magnetooptical medium, and polarizing filter. Coming out of the modulator, the electrically or magnetically intensity-modulated beam passes through the optical fiber into the photodetector as typified by a photodiode or photomultiplier tube. The photodetector derives from the incoming beam a signal indicative of the electric or magnetic quantity being applied to the modulator.

Optical fibers available today have still certain weaknesses, however. Take, for example, the familiar multimode fiber of the type having a central portion, or core, surrounded by an outer layer of material with a slightly lower refractive index, called the cladding. Light rays travel through the fiber by undergoing series of total reflections at the core-cladding interface. Thus are the light rays trapped inside the fiber core. Let $n_1$ be the refractive index of the core, and $n_2$ the refractive index of the cladding, $n_1$ being greater than $n_2$ as aforesaid. The maximum glancing angle, or critical angle, $\theta_c$ at which total reflection occurs at the core-cladding interface is expressed as $$\theta_c = \cos^{-1} n_2/n_1. \tag{1}$$

A problem arises because of the almost unavoidable bends and curves of the optical fiber in use. At such bends or curves, part of the traveling rays of light will strike the core-cladding interface at more than the critical angle $\theta_c$ and so, instead of being reflected back into the core, pass into the cladding to be absorbed by the jacket applied to the outside of the fiber. Thus light loss in optical fibers is subject to change depending in part on their linearity, or the degree to which they are bent or curved.

Another possible cause of variation in transmission loss is ambient temperature. In some optical fibers the refractive indexes of the core and the cladding change differently with ambient temperatures. An example of such fibers is the one having a core made of fused quartz and a cladding made of a silicone resin. Then the critical angle $\theta_c$, and in consequence the light loss, of the fiber vary with ambient temperatures.

Still another possible cause of variable transmission loss in optical fibers is the connectors or couplings for detachably connecting the lengths of fibers end to end. In the mentioned electric or magnetic measuring system the use of such fiber connectors is common at the exit of the light source, at the entrance and exit of the electro- or magnetooptical modulator, and at the entance of the photodetector, for the ease of system installation or transportation. Each fiber connector holds two optical fiber lengths endwise against each other, with a preassigned spacing therebetween, as will be later explained in more detail in connection with one of the drawings attached hereto. The connectors employ cap nuts for the detachable connection of the fiber lengths. The cap nuts are easy to loosen in the use of the measuring system in locations subject to mechanical vibrations. Thereupon the spacing between the opposed ends of the fiber lengths may change, or either or both of the fiber lengths may move out of alignment with each other. Such changes in the end-to-end spacing of the fiber lengths, or their misalignment, no matter how small, incurs very substantial fluctuations in coupling loss because the core diameter of the optical fiber under consideration is as small as 50 micrometers or so.

The foregoing will have made clear that variable light loss occurs almost unavoidably in the optical fibers of the above defined type by reasons of: (1) the bends or curves of the fibers; (2) changes in ambient temperature; and (3) the loosening of the fiber connectors. The fluctuations in light loss due to such unpredictable factors had rendered the noted conventional system quite unreliable, unsuitable for accurate measurement of electric or magnetic quantities.

In the above referenced Japanese Patent Application No. 55-22449, therefore, I proposed a novel optoelectronic measuring system (shown in FIG. 1 of the accompanying drawings) free from the drawbacks of the more conventional system. The measuring system according to this Japanese application uses two light beams of different wavelengths, as will be detailed later. It substantially succeeds in preventing the optoelectronic measurement of electric or magnetic quantities from being affected by the variable light loss due to the listed unpredictable factors.

As has later proved, however, the known two-beam measuring system has a problem in connection with the relative wavelengths of the two light beams. The wavelengths of the beams should be close to each other in order for the beams to suffer approximately the same transmission losses due to the bending or curving of the optical fibers and approximately the same coupling losses due to the loosening of the fiber connectors. The use of beams of such close wavelengths results, however, in the reduced sensitivity of the system with respect to the quantities to be measured. For this reduced sensitivity the prior art system has required expensive equipment for accurate measurement of the desired quantities.

SUMMARY OF THE INVENTION

My present invention remedies the problem of reduced sensitivity arising from the use of two beams of close wavelengths in the optoelectronic two-beam measurement of electric or magnetic quantities, thereby making it possible to accurately measure the quantities with use of less expensive equipment than has been required heretofore.

According to the optoelectric measuring method of my invention, stated in brief, two beams of light are used which have different wavelengths and a substantially predetermined ratio of initial intensities. The two beams are combined and sent over a first common path, normally including lengths of optical fiber with connectors, to a modulator station. At this station the two combined beams are first polarized and then modulated, either electro- or magnetooptically, in accordance with the quantity to be measured. Only one of the modulated beams is then polarized into an equivalently intensity-modulated beam whereas the other is unpolarized to remain as a non-intensity-modulated beam. Leaving the modulator station, the intensity- and non-intensity-modulated beams travel through a second common path, again normally in the form of lengths of optical fiber with connectors, and then separated from each other to have their intensities measured as by respective photodetectors. The electric or magnetic quantity applied to the beams at the modulator station can be computed from the relative initial intensities of the two beams and the relative intensities of the intensity- and non-intensity-modulated beams incident upon the photodetectors.

The selective polarization of the two modulated beams into the intensity- and non-intensity-modulated beams makes it possible to make their wavelengths sufficiently close to each other without sacrifice of the system sensitivity. Further the improved measuring method is totally unaffected by variable light losses during transmission through the optical fibers and their connectors. The method, as well as the system constructed to carry the method into practice, is well suited for accurate measurement of, for example, high voltages under circumstances where the optical fibers with their connectors must be placed in direct exposure to the wind, mechanical vibrations, or excessive temperature changes, or of electrostatic charges in an atmosphere of flammable gases.

The optoelectronic measuring system of my invention particularly features a wavelength-dependent, selective polarizing filter for polarizing only one of the two incident modulated beams to provide an intensity-modulated beam. In a preferred embodiment the selective polarizing filter is formed by alternately stacking several layers of one dielectric and several layers of another dielectric on a pane of glass, with the two dielectrics having different refractive indexes. Oriented at a prescribed angle to the common path of the two incident beams, the thus-fabricated polarizing filter can perform the intended function to the full.

The above and other features and advantages of my invention and the manner of attaining them will become more apparent, and the invention itself will best be understood, from a study of the following description taken together with the attached drawings.

DETAILED DESCRIPTION

Figure 1:
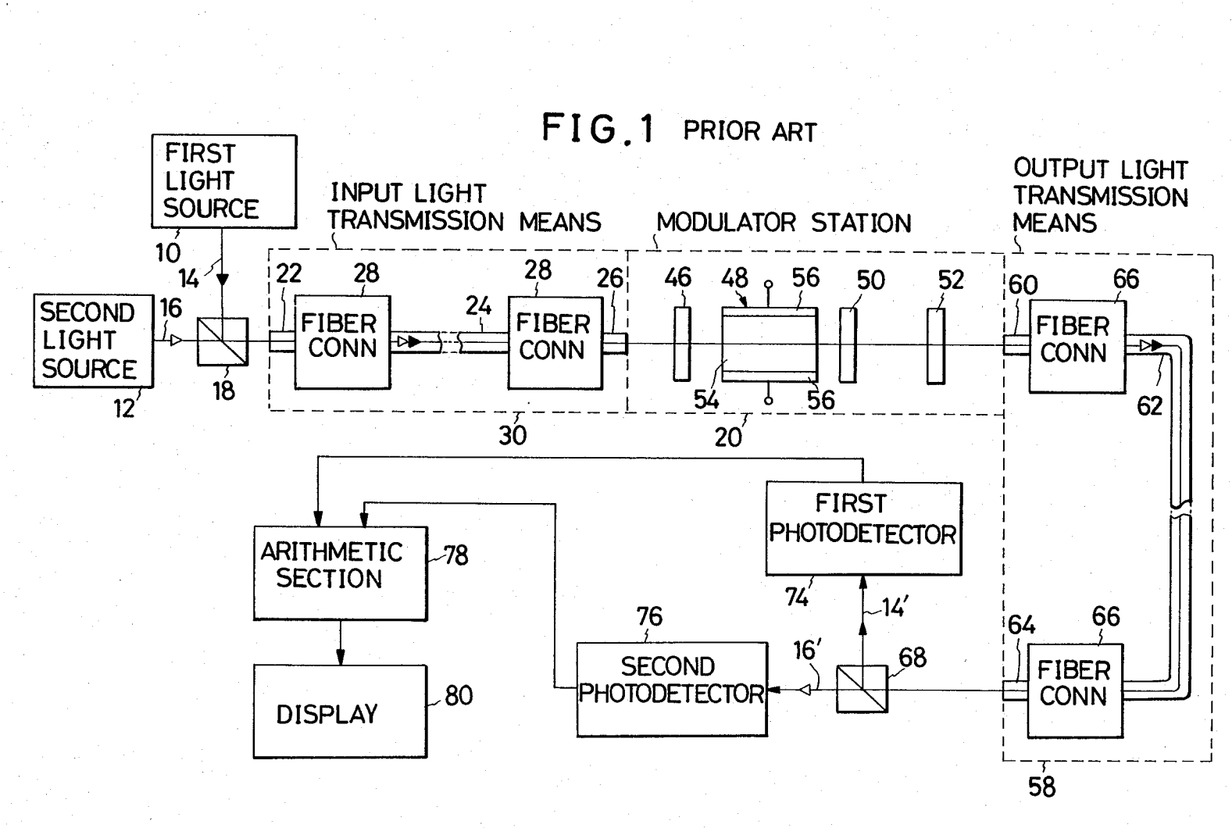
FIG. 1 is a schematic representation, mostly in block diagrammatic form, of the prior art two-beam system for the optoelectronic measurement of electric or magnetic quantities.

It will first describe in some more detail the prior art system of FIG. 1, disclosed in the aforementioned Japanese Patent Application No. 55-22449, the better to make clear the features and advantages of my present invention. The measuring system has two light sources 10 and 12 each in the form of a laser, LED, etc. These light sources emit beams 14 and 16 of light having different wavelengths $\lambda_1$ and $\lambda_2$ respectively. The light beams 14 and 16 are directed toward a junction unit 18 which functions to combine the two incoming beams and to make them follow the same path thereafter. It will be easy for the optics specialists to devise such a junction unit with use of, for example, an inteference filter, half-silvered or semitransparent mirror, or waveguide system.

Emerging from the junction unit 18, the combined light beams 14 and 16 travel toward a modulator station 20 via a common path formed by successive lengths 22, 24 and 26 of optical fiber. Two fiber connectors 28 of identical design connect the three fiber lengths 22, 24 and 26 end to end. These fiber lengths together with the connectors make up input light transmission means shown enclosed in the rectangular outline generally referenced 30.

Figure 2:
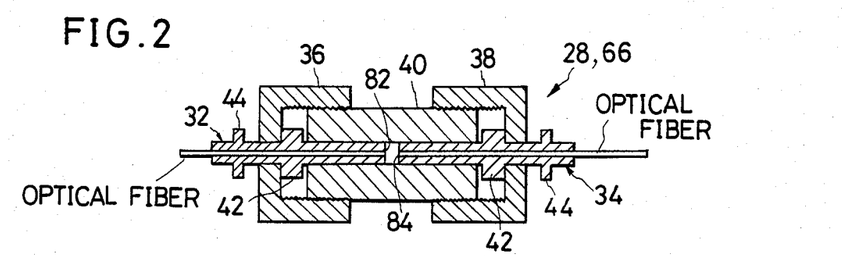
FIG. 2 is an axial section through each of the optical fibers connectors used in the measuring system of FIG. 1.

FIG. 2 is a detailed representation, in axial section, of each fiber connector 28. The two lengths of fiber to be coupled, 22 and 24, or 24 and 26, have their opposed end portions inserted in respective metal-made sleeves 32 and 34 and secured thereto with an adhesive. The sleeves 32 and 34 are inserted into and through respective centrally cored cap nuts 36 and 38 and further into a common cylindrical receptacle 40 from its opposite ends. Two collars 42 and 44 on each of the sleeves 32 and 34 restrain the cap nut 36 or 38 from axial displacement thereon. The cap nuts themselves are threaded onto the receptacle 40 to hold the sleeved ends of the optical fibers inserted therein. As has been mentioned, in the fiber connector 28 of this known construction, the pair of cap nuts 36 and 38 are easy to loosen when subjected to vibrations, resulting in changes in the spacing between the opposed ends of the fibers and/or in their misalignment.

With reference back to FIG. 1 the modulator station 20 is herein shown adapted to modulate the incoming combined beams 14 and 16 by the electrooptical Pockels effect. Disposed sequentially at this station, in the order of arrangement along the light path from the input toward the output side, are:

1. A polarizer 46 for linearly polarizing the incoming beams 14 and 16.

2. An electrooptical modulator 48 for modulating the plane-polarized beams 14 and 16 in accordance with the quantity to be measured.

3. A phase element or quarter-wave plate 50 for imparting a predetermined optical bias to the modulated beams.

4. A polarizing filter 52 for processing the incident beams into intensity-modulated ones representative of the quantity under measurement.

The electrooptical modulator 48 comprises a Pockels or electrooptical crystal 54 such as KDP or LiNbO$_3$, and a pair of electrodes 56 for application of a voltage to be measured. Plane-polarized by the polarizer 46, the two incoming beams are each divided into two characteristically polarized components in the Pockels crystal 54. The two polarized components of each beam, on leaving the crystal, have a phase difference proportional to the voltage impressed from the electrode pair 56. The beam components with the phase differences are subsequently biased by the quarter-wave plate 50 and again polarized by the polarizing filter 52 into intensity-modulated beams. Thus the output beams of the modulator station 20 bear intensities that have been modulated in accordance with the phase differences between the output waves of the electrooptical modulator 48 and, for therefore, with the voltage impressed across the Pockels crystal 54.

The intensity-modulated output beams of the modulator station 20 travel through output light transmission means generally labeled 58. Like the input light transmission means 30 the output light transmission means 58 comprise lengths 60, 62 and 64 of optical fiber connected end to end by fiber connectors 66. The construction of these fiber connectors is identical with that of the connectors 28 of the input light transmission means 30, so that reference is directed to FIG. 2 for further details.

Positioned immediately after the output light transmission means 58, a beam splitter 68 separates the intensity-modulated output beams of the modulator station 20 from each other, causing them to trace different paths thereafter. In practice the beam splitter 68 can take the form of an interference filter, prism, or refraction grating.

The individual first and second intensity-modulated beams, designated 14' and 16' in contradistinction to the original unmodulated beams 14 and 16, travel from the beam splitter 68 to first 74 and second 76 photodetectors respectively. These photodetectors sense the intensities of the incoming modulated beams 14' and 16' and produce corresponding electrical outputs for delivery to an arithmetic section 78. In response to these photodetector outputs, and from the initial intensities of the unmodulated beams 14 and 16, the arithmetic section 78 computes, for instance, the strength of the electric field applied at the modulator station 20. The arithmetic section 78 can be a digital microcomputer with a prepositioned analog-to-digital converter. A display 80 makes a visual indication of the output from the arithmetic section.

For voltage measurement by this prior art two-beam system of FIG. 1 the voltage to be measured may be impressed across the Pockels crystal 54 of the electrooptical modulator 48 at the station 20. Also the first 10 and second 12 light sources may be made to emit the first 14 and second 16 light beams of the different wavelengths $\lambda_1$ and $\lambda_2$ at an approximately preassigned ratio of intensities. Joined by the junction unit 18, the two light beams 14 and 16 follow the common path formed by the input light transmission means 30 and enter the modulator station 20. At this station, as has been stated, the beams are intensity modulated in accordance with the applied voltage. The intensity-modulated beams again follow the common path, formed by the output transmission means 58, from the modulator station 20 to the beam splitter 68, thereby to be split into the two separate beams 14' and 16' of the different wavelengths. The first 74 and second 76 photodetectors sense the intensities of the intensity-modulated beams 14' and 16'. The arithmetic section 78 ascertains the applied voltage from the initial intensity ratio of the unmodulated input beams 14 and 16 and the intensity ratio of the intensity-modulated output beams 14' and 16'.

From Equation (1) we have seen that only the ratio of the refractive indexes of optical fiber core and cladding determines the critical glancing angle at which total reflection occurs at the core-cladding interface. For the two required light beams of different wavelengths, therefore, the critical angle of total reflection can be made approximately equal, as will be understood from the following discussion of FIG. 3.

Figure 3:
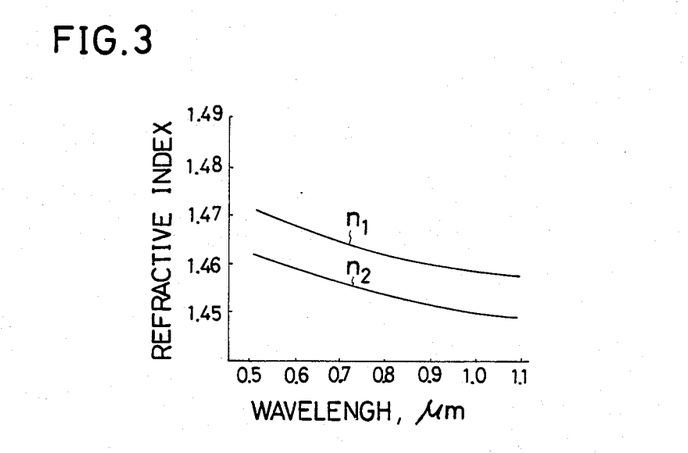
FIG. 3 is a graph plotting the curves of the refractive indexes of the core and cladding of a well known optical fiber against the wavelengths of the light traveling therethrough.

The graph of FIG. 3 plots the refractive indexes $n_1$ and $n_2$ of the core and cladding, respectively, of the optical fiber of the type in question against the wavelengths, in micrometers, of the light passing therethrough. The fiber core is of quartz ($SiO_2$) doped with 3.4 percent by weight of titanium dioxide ($TiO_2$), having a diameter of 60 micrometers. The cladding is of quartz. For beams having wavelengths of 0.7 and 0.8 micrometers the critical total reflection angles of this optical fiber differ by as little as 0.3 percent or so. Even if the fiber is bent or curved in various ways in use, its critical total reflection angles remain approximately the same for the two beams of the 0.7 and 0.8 micrometers wavelengths, so that its transmission losses also vary in nearly the same way for the two beams. In other words, the ratio of the transmission losses for the two beams remains substantially constant.

Let us then consider those optical fibers wherein the refractive indexes of the core and the cladding vary with temperature at different rates. In this case, too, the critical total reflection angles of the fiber for the two beams of the different wavelengths differ in the same manner with temperature. Accordingly the ratio of the transmission losses for the two beams remain approximately constant in spite of changes in temperature.

The prior art system of FIG. 1 also overcomes the problem of variable light loss arising from the use of the optical fiber connectors 28 and 66. The coupling loss of light due to the fiber connectors has a wavelength dependency determined by the angle at which the light emerges from the end 82, FIG. 2, of the upstream fiber and by the angle at which the light impinges on the opposed end 84 of the downstream fiber. These angles depend upon the refractive indexes $n_1$ and $n_2$ of the core and cladding of the fibers, as follows:

$$\theta d = \theta i = \sin^{-1}(n_1^2 - n_2^2)^{\frac{1}{2}} \quad (2)$$

where $\theta d$ is the angle of emergence and $\theta i$ is the angle of incidence. From this equation we can compute the angles of emergence or incidence for the two beams having wavelengths of 0.7 and 0.8 micrometers, by using the corresponding refractive indexes of the fiber core and cladding given graphically in FIG. 3. The computations will show that the angles are approximately the same for the two beams. This means that the coupling losses for the two beams vary at the same rate with changes in the distance between the opposed ends 82 and 84 of the fiber lengths or with their relative displacement out of axial alignment. The ratio of the coupling losses is constant in spite of such possible troubles.

The light modulation at the electrooptical (as well as magnetooptical) modulator station 20 also has a wavelength dependency. In the case of modulation by the Pockels effect the wavelength dependency can be expressed as $$I_o = I_i \sin^2\left(\frac{A}{\lambda} E\right) \quad (3)$$

where $I_i$ is the intensity of the incoming light, $I_o$ is the intensity of the outgoing light, A is a constant, $\lambda$ is the wavelength of the modulated light, and E is the strength of the applied electric field. For modulation by the Faraday effect the wavelength dependency is $$I_o = I_i \cos^2\left(\frac{B}{\lambda^2} H\right) \quad (4)$$

where B is a constant, and H is the strength of the applied magnetic field.

Now, in the prior art system of FIG. 1, which utilizes the Pockels effect, we may define the intensities $I_{1o}$ and $I_{2o}$ of the individual beam 14' and 16' incident upon the respective photodetectors 74 and 76 as follows, disregarding for convenience the constants representative of the absorption and scattering losses, etc., of the beams during transmission through the optical fibers:

$$I_{1o} = I_{1i} \cdot \gamma_{1i} \cdot \delta_1 \cdot \gamma_{1o} \cdot \sin^2\left(\frac{A}{\lambda_1} E\right) \quad (5)$$

and $$I_{2o} = I_{2i} \cdot \gamma_{2i} \cdot \delta_2 \cdot \gamma_{2o} \cdot \sin^2\left(\frac{A}{\lambda_2} E\right) \quad (6)$$

where: $\lambda_1$ and $\lambda_2$ = the wavelengths of the output beams 14 and 16 of the light sources 10 and 12;

$I_{1i}$ and $I_{2i}$ = the initial intensities of the beams 14 and 16;

$\gamma_{1i}$ and $\gamma_{2i}$ = the transmission losses of the input optical fiber;

$\delta_1$ and $\delta_2$ = the coupling losses due to the fiber connectors; and $\gamma_{1o}$ and $\gamma_{2o}$ = the transmission losses of the output light transmission means 58.

As has already been explained, the variable light losses due to the bending or curving of the optical fibers and to the presence of the fiber connectors occur equally for the two beams of different wavelengths. That is, $$\gamma_{1i} = \gamma_{2i}, \; \delta_1 = \delta_2 \text{ and } \gamma_{1o} = \gamma_{2o}.$$

Hence the ratio $I_{1o}/I_{2o}$ of the intensities of the beams 14' and 16' incident upon the photodetectors 74 and 76 is, from Equations (5) and (6), $$\frac{I_{1o}}{I_{2o}} = \frac{I_{1i}}{I_{2i}} \cdot \frac{\sin^2 (A/\lambda_1 E)}{\sin^2 (A/\lambda_2 E)}. \quad (7)$$

This intensity ratio of the intensity-modulated beams 14' and 16' is the function of the strength of the electric field applied at the electrooptical modulator 48, independent of the variable transmission losses of the optical fibers and of the variable coupling losses of the fiber connectors. The ratio $I_{1i}/I_{2i}$ of the initial intensities of the beams 14 and 16 can be made constant by presetting the light sources 10 and 12 or can be measured constantly. The wavelengths $\lambda_1$ and $\lambda_2$ of these beams are predetermined. We may therefore express the right hand side of Equation (7) as a function of the applied field strength E, as follows:

$$\frac{\sin^2 (A/\lambda_1 \cdot E)}{\sin^2 (A/\lambda_2 \cdot E)} = f(E). \quad (8)$$

Thus, from Equations (7) and (8), $$E = f^{-1}\left(\frac{I_{1o}}{I_{2o}} \cdot \frac{I_{2i}}{I_{1i}}\right). \tag{9}$$

Here the inverse function $f^{-1}$ is known. Consequently, if only we measure the relative intensities $I_{1o}$ and $I_{2o}$ of the intensity-modulated beams 14' and 16' and apply to Equation (9), we can compute, with the arithmetic section 78, the applied field strength E irrespective of the unavoidable fluctuations in transmission losses due to the bending or curving of the optical fibers and to the loosening of the fiber connectors.

We have so far studied the operating theory of the prior art two-beam system of FIG. 1 as applied to the measurement of the strength of the applied electric field by the Pockels effect. It will be seen, then that the same theory applies to the measurement of applied magnetic field strengths by the Faraday effect.

In spite of its marked advantage over the more conventional one-beam measuring system, the two-beam system of FIG. 1 has proved to have one drawback with regard to the choice of the relative wavelengths of the two beams for use. The wavelengths should not be too far apart in order to make approximately the same the critical total reflection angles and angular apertures (or angles of incidence) of the optical fibers for the two beams. If they were, the optical fibers would offer inconveniently different critical angles and angular apertures for the two beams, as will be seen from FIG. 3. However, when the wavelengths are made close to each other, the relative intensities of the intensity-modulated beams differ little with changes in the applied electric or magnetic quantities; that is, the sensitivity of the system lessens.

Let $f(\lambda, D)$ be the function representative of the dependency of the Pockels or Faraday effect on the wavelengths $\lambda_1$ and $\lambda_2$ and on the applied electric quantity D. Then the relative intensities of the intensity-modulated beams are given by $$\frac{I_{1o}}{I_{2o}} = \frac{I_{1i}}{I_{2i}} \cdot \frac{f(\lambda_1, D)}{f(\lambda_2, D)}. \tag{10}$$

The rate of change of the ratio $I_{1o}/I_{2o}$ with respect to changes in the applied electric quantity D can be computed by the equation, $$\frac{d(I_{1o}/I_{2o})}{dD} = \frac{I_{1i}}{I_{2i}} \cdot \tag{11}$$

$$\frac{f'(\lambda_1, D) \cdot f(\lambda_2, D) - f(\lambda_1, D) \cdot f'(\lambda_2, D)}{f^2(\lambda_2, D)}$$

where f' is the differential of the applied electric quantity D.

Thus, as the wavelengths $\lambda_1$ and $\lambda_2$ of the two beams come close to each other, $f(\lambda_1, D)$ approximates $f(\lambda_2, D)$, whereas $f'(\lambda_1, D)$ approximates $f'(\lambda_2, D)$. As then the numerator of the right hand side of Equation (11) decreases, so does the rate of change of the ratio $I_{1o}/I_{2o}$ (i.e., the sensitivity of the measuring system) with respect to applied electric quantities. For this reason the known two-beam system has demanded, for accurate measurement of electric or magnetic quantities, the use of high sensitivity photodetectors and of a digital computer having a large number of effective digits for calculation of the function $f^{-1}$.

Figure 4:
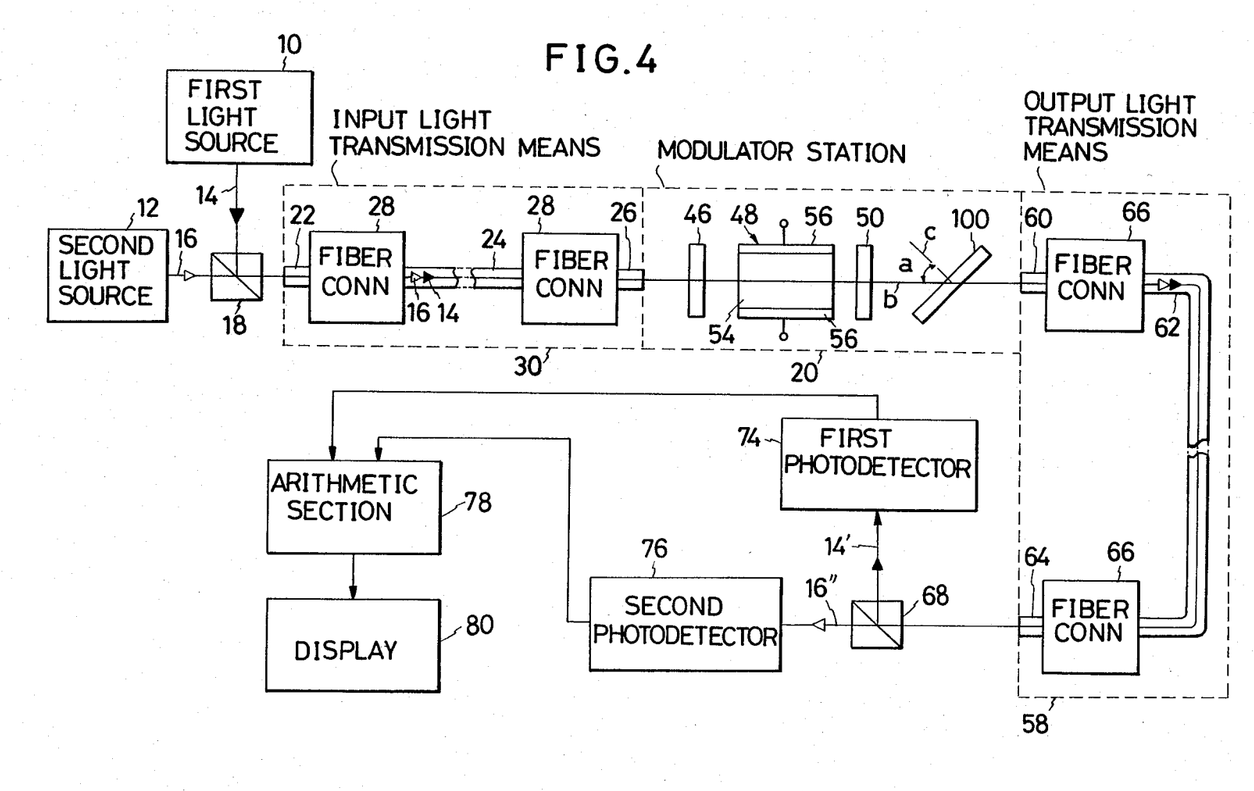
FIG. 4 is a schematic representation, mostly in block diagrammatic form, of the improved two-beam measuring system in accordance with my present invention.

My present invention concerns an improved version of the above known two-beam measuring system, thoroughly retaining its advantages and remedying its drawback. FIG. 4 shows the improved system. A comparison of this figure with FIG. 1 will reveal that like reference characters are used to denote the corresponding parts of the prior art and inventive systems. The constructions and functions of such parts of the inventive system are substantially (not exactly in some instances) identical with those of the corresponding parts of the conventional system. No more detailed discussion of these known parts of the improved system will be necessary, except the following list of the preferred forms which some pertinent parts take in practice:

First light source 10—An LED capable of emitting a light beam having a center wavelength $\lambda_1$ of 0.74 micrometer and a maximum intensity of 29.1 milliwatts.

Second light source 12—An LED capable of emitting a light beam having a center wavelength $\lambda_2$ of 0.88 micrometer and a maximum intensity of 42 milliwatts.

Junction unit 18 and beam splitter 68—Interference film filters reflecting the first light beam 14 (center wavelength 0.74 micrometer) and transmitting the second light beam 16 (center wavelength 0.88 micrometer).

Optical fibers 24, 62, etc.—Quartz glass fibers with a core diameter of 60 micrometers, a cladding diameter of 150 micrometers, and a numerical aperture (sin $\theta$) of 0.02.

Crystal 54 of of the electrooptical modulator 48—An LiNbO$_3$ crystal.

Photodetectors 74 and 76—Photodiodes.

The improved two-beam measuring system of FIG. 4 features a wavelength-dependent, selective polarizing filter 100, used in place of the polarizing filter 52 of the prior art system, positioned after the quarter-wave plate 50 and forming the final stage of the modulator station 20. The selective polarizing filter 100 has a wavelength dependency such that it polarizes only the first modulated beam and passes the second modulated beam without polarization. Such a wavelength-dependent polarizing filter can be fabricated by use of two kinds of dielectric layers, with an optical thickness of one quarter-wavelength, having different refractive indexes. A plurality of one kind, and a plurality of the other kind, of such dielectric layers are alternately stacked up to form, in fact, an interference filter, which is arranged at an angle to the path of the beams to perform the desired function.

Figure 5:
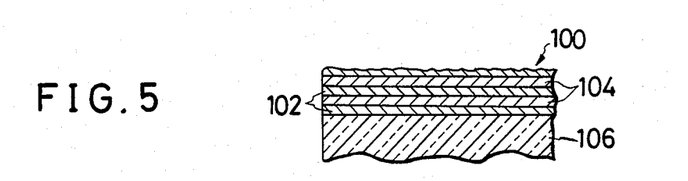
FIG. 5 is a fragmentary section through an example of the wavelength-dependent, selective polarizing filter in the improved measuring system of FIG. 4.

FIG. 5 represents a fragmentary section through an example of such wavelength-dependent polarizing filter 100. As the two required dielectrics having different refractive indexes there are employed silicon dioxide (SiO$_2$) with a refractive index of 1.5 and titanium dioxide (TiO$_2$) with a refractive index of 2.4. The two dielectrics are alternately layered at 102 (SiO$_2$) and 104 (TiO$_2$) by successive steps of vapor deposition on a pane of glass 106. The exemplified selective polarizing filter 100 comprises ten SiO$_2$ layers and ten TiO$_2$ layers, with each SiO$_2$ layer having a thickness of 0.1330 micrometer and each TiO$_2$ layer having a thickness of 0.0830 micrometer.

As will be noted by referring back to FIG. 4, the selective polarizing filter 100 is oriented with an angle a of 50 degrees between the beam path b and a line c normal to the filter. The angle a can normally be anywhere between about 30° and 80°.

Figure 6:
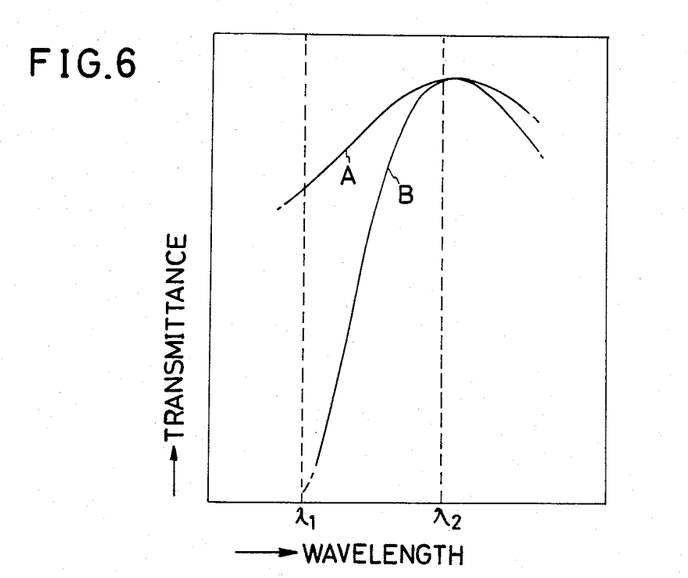
FIG. 6 is a graph explanatory of the performance of the selective polarizing filter of FIG. 5.

FIG. 6 graphically demonstrates the transmission characteristics of the exemplified selective polarizing filter 100 with respect to the wavelength of the incident light. As represented by the curve A in the graph, for a polarized beam component with the electric field vibrating in a plane perpendicular to the plane of incidence (i.e., the plane passing through the beam path b and the normal c, FIG. 4), the transmittance of the selective polarizing filter 100 does not decrease too abruptly with a decrease in wavelength. The curve B indicates, on the other hand, that for a polarized beam component with the electric field vibrating in a plane parallel to the plane of incidence, the transmittance of the filter 100 does drop sharply with a decrease in wavelength. Accordingly the selective polarizing filter offers a wide difference in transmittance between the two components at a light beam having the wavelength $\lambda_1$, but practically no difference at all in transmitting the two components of a light beam having the wavelength $\lambda_2$. In the improved two-beam system of FIG. 4 the first input beam 14 has the wavelength $\lambda_1$, and the second input beam 16 has the wavelength $\lambda_2$, so that the wavelength-dependent polarizing filter 100 polarizes only the first beam and passes the second beam without polarization.

The following is the operational description of the improved two-beam measuring system, which will serve also as a disclosure of the inventive method. As the first 10 and second 12 light sources are set into operation, they emit light beams 14 and 16 of the different wavelengths $\lambda_1$ and $\lambda_2$ at a fixed ratio of intensities. These beams meet each other at the junction unit 18. Thereafter the two beams follow the common path through the input light transmission means 30 to the modulator station 20.

At this modulator station the two combined beams 14 and 16 are both first plane polarized by the polarizer 46. The plane-polarized beams fall on the Pockels crystal 54 of the modulator 48 thereby to be modulated electro-optically. As is well known, each of the plane-polarized beams issue from the Pockels crystal 54 with a phase difference between its two components. This phase difference is determined by the voltage or charge impressed from the pair of electrodes 56.

Then, after being optically biased by the quarter-wave plate 50, the two plane-polarized and electrooptically modulated beams fall on the selective polarizing filter 100. Since this polarizing filter has the wavelength dependency explained in connection with FIG. 6, the first beam 14 is thereby polarized into an intensity-modulated beam bearing an intensity corresponding to the phase difference between its two components. The second beam, however, traverses the polarizing filter without being polarized. Even though the second beam also emerges from the Pockels crystal 54 with a phase difference between its two polarized components in accordance with the electric quantity to be measured, the second beam still has the wavelength $\lambda_2$ and so travels through the selective polarizing filter 100 without polarization regardless of the phase difference.

It is thus seen that there emerge from the modulator station 20 the intensity-modulated first beam 14′, bearing an intensity representative of the electric quantity under measurement as in the prior art system of FIG. 1, and the non-intensity-modulated second beam 16″. Still sharing a common path, the intensity-modulated first beam 14′ and the non-intensity-modulated second beam 16″ travel through the output light transmission means 58 and fall on the beam splitter 68. The beam splitter splits the incident light into the intensity-modulated first beam 14′ and the non-intensity-modulated second beam 16″, for delivery to the first 74 and second 76 photodetectors respectively.

As the first beam 14 or 14′ is intensity modulated, and the second beam 16 or 16″ is not, according to the principles of my present invention, the intensities of the two beams incident upon the respective photodetectors 74 and 76 are given by $$I_{1o} = I_{1i} \cdot \gamma_{1i} \cdot \gamma_{1o} \cdot \delta_1 \cdot f(\lambda_1, D) \tag{12}$$

and $$I_{2o} = I_{2i} \cdot \gamma_{2i} \cdot \gamma_{2o} \cdot \delta_2. \tag{13}$$

Therfore, from Equations (12) and (13), the relative intensities of the output beams 14′ and 16″ are $$\frac{I_{1o}}{I_{2o}} = \frac{I_{1i}}{I_{2i}} f(\lambda_1, D) \tag{14}$$

from which the applied electric quantity D to be measured may be defined as the inverse function of Equation (14), as follows:

$$D = f^{-1}\left(\lambda_1, \frac{I_{1o}}{I_{2o}} \cdot \frac{I_{2i}}{I_{1i}}\right). \tag{15}$$

The inverse function $f^{-1}$ is known. Further the intensity ratio $I_{2i}/I_{1i}$ of the input beams 14 and 16 can be made constant by controlling the light sources 10 and 12 or can be measured constantly. It is therefore possible to compute the electric quantity D under measurement by the arithmetic section 78 in accordance with Equation (15). The display 80 visually represents the result of such computation. Equation (15) does not include terms affected by transmission or coupling losses. This means that the applied electric quantity D can be measured without being affected by variable transmission losses due to the bending or curving of the optical fibers or of variable coupling losses due to the loosening of the fiber connectors.

The improved sensitivity (i.e., the change in the relative intensities of the output beams 14′ and 16″ with respect to a change in the applied electric quantity D) of the improved two-beam measuring system constitutes one of the most pronounced features of the invention. The sensitivity can be given by differentiating Equation (14) by the applied electric quantity D. Namely, $$\frac{d(I_{1o}/I_{2o})}{dD} = \frac{I_{1i}}{I_{2i}} f'(\lambda_1, D) \tag{16}$$

The sensitivity is affected by the wavelength $\lambda_1$ of the first beam 14, which is intensity modulated, but not by the wavelength $\lambda_2$ of the second beam 16 which is not intensity modulated. Accordingly, unlike the prior art case discussed in conjunction with Equation (11), the sensitivity of the improved system does not deteriorate if the wavelengths of the two beams are close to each other.

The following Table represents the actual values of the sensitivities of the prior art system of FIG. 1 and the inventive system of FIG. 4 as calculated by Equations (11) and (16) respectively. Also given in the Table are the values of the intensity ratio $I_{1o}/I_{2o}$ of the output beams 14' and 16' or 16" at applied voltages of 500 and 501 volts, in accordance with the prior art and with the invention. In thus testing the sensitivities of the prior art and inventive systems the wavelength of the first beam 14 was set at 0.8 micrometer, and that of the second beam 16 at 0.7 micrometer. The pair of electrodes 56 of the optical modulator 48 were laid parallel to the direction of propagation of the two combined beams through the crystal 54, as in both FIGS. 1 and 4. The dimensions of the crystal 54, in the direction of light propagation therethrough and in the direction of voltage application, were so determined that for the first beam having the wavelength of 0.8 micrometer, the half-wavelength voltage $V_\pi$ (i.e., the applied voltage at which the phase difference between the two polarized components in the electrooptical crystal is $\pi$) was 1000 volts. As is evident from Equation (3), therefore, the V voltage for the second beam having the wavelength of 0.7 micrometer was 875 volts. The intensity ratio $I_{1i}/I_{2i}$ of the input beams 14 and 16 was unity.

|  | Prior Art | Invention |
| --- | --- | --- |
| Sensitivity $d(I_o/I_o)/dD$ | 0.0001/volt[a] | 0.002/volt[b] |
| Output beam intensity ratio $I_o/I_o$ at 500 volts | 0.8050[c] | 0.500[d] |
| Output beam intensity ratio $I_o/I_o$ at 501 volts | 0.8051[c] | 0.502[d] |

Notes: [a]Computed by Equation (11).
[b]Computed by Equation (16).
[c]Computed by Equation (10).
[d]Computed by Equation (14).

The above Table proves that the known two-beam measuring system requires numbers of four figures to indicate the difference between the applied voltages of 500 and 501 volts. Accordingly, for the detection of one-volt differences at least in the neighborhood of 500 volts, the photodetectors 74 and 76 must be accurate to numbers of four or more figures. The digital computer incorporated in the arithmetic section 78 must also have an effective number of digits of four or more.

According to the improved two-beam system of my present invention, on the other hand, three-figure numbers can indicate the difference between the applied 500 and 501 volts. The photodetectors in use need to be accurate to three-digit numbers, and the effective number of digits of the digital computer can be three or so, resulting in substantial reduction in the cost of the system. If the improved system incorporates photodetectors of the same sensitivity as that of the photodetectors in the conventional system, and a digital computer having the same number of effective digits as that of the one in the conventional system, then the improved system will measure desired quantities more exactly.

Figure 7:
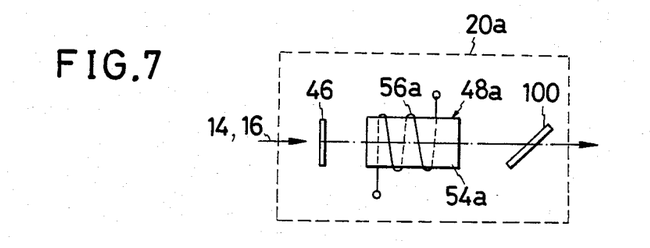
FIG. 7 is a schematic representation of a modification of the modulator station in the improved measuring system of FIG. 4.

FIG. 7 shows an alternative form of the modulator station for use in the improved two-beam measuring system of FIG. 4. Generally designated 20a, the alternative modulator station is adapted for magnetooptically modulating the incoming combined light beams 14 and 16 by the Faraday effect. Employed to this end is a magnetooptical modulator 48a used in place of the electrooptical modulator 48 of the FIG. 4 embodiment. The magnetooptical modulator 48a comprises a Faraday medium 54a and a coil 56a surrounding same for creating a magnetic field therein. Also disposed at the magnetooptical modulator station 20a are the polarizer 46 for linearly polarizing the beams 14 and 16, and the wavelength-dependent, selective polarizing filter 100 for translating the first beam 14 into an intensity-modulated beam and passing the second beam 16 as a non-intensity-modulated beam. The other details of construction and operation of the measuring system incorporating this alternative modulator station 20a, as well as advantages accruing therefrom, are substantially as set forth above in connection with the FIG. 4 system.

Although I have shown and described my invention in terms of what I have conceived to be the most practical and preferable forms, I recognize, of course, that modifications and variations will readily occur to those skilled in the optoelectronics art to conform to system requirements or design preferences. The following is a list of examples of such possible modifications and variations:

1. The two light beams 14 and 16 need not necessarily be simultaneously transmitted over the common path but by time-division multiplexing.

2. While the use of two beams of different wavelengths are essential, one or more beams may be used additionally, for measuring electric or magnetic quantities with beam combinations of two or more.

3. The invention lends itself to measurement of not only voltages and currents but also electric fields, magnetic fields, charges, etc., in an essentially identical manner. 4. Optical fibers for use in the input 30 and output 58 light transmission means need not be of the multimode type but could be of the parabolically graded or other suitable types.

5. The use of the fiber connectors 28 and 66 is not an absolute requirement, as the optical modulator 20 or 20a might be optically connected to the junction unit 18 and to the beam splitter 68 by continuous lengths of optical fiber.

6. The pair of electrodes 56 on the Pockels crystal 54 of the electrooptical modulator 48 and the coil 56a around the Faraday medium 54a of the magnetooptical modulator 48a might both be omitted, provided that electric or magnetic fields could be created in the Pockels crystal or Faraday medium without aid of such means.

7. The pair of electrodes 56 may not necessarily be laid parallel to the direction of propagation of the light beams through the Pockels crystal 54 but normal to the direction of beam propagation.

8. As an alternative to the illustrated configuration of the magnetooptical modulator 48a, having the Faraday medium 54a encircled by the coil 56a, a fiber of magnetooptical material may be coiled around a conductor through which a current flows, with the beams to be modulated passed through the magnetooptical fiber.

9. There are two possible ways of inputting data concerning the initial intensities of the beams 14 and 16 into the arithmetic section 78 for computation of the applied electric or magnetic quantity. One is to previously introduce the predetermined initial intensity data into the arithmetic section. The other is to constantly measure the initial beam intensities, as from the currents flowing through LEDs, for example, serving as the light sources, and to deliver in real time the thus-obtained initial intensity data to the arithmetic section.

All these and other changes of the illustrated embodiments are intended in the foregoing disclosure; therefore, my invention is to be limited only by the terms of the claims which follow.

I claim:

1. A method of optoelectronically measuring electric quantities such as voltages, charges and current magnitudes, or magnetic quantities such as magnetic field strengths, which comprises:
   (a) generating first and second beams of light of different wavelengths at a substantially predetermined ratio of intensities;
   (b) combining the first and second beams;
   (c) transmitting the combined first and second beams over a first common path;
   (d) polarizing the first and second beams;
   (e) modulating the phases of the polarized first and second beams in accordance with a desired quantity of electricity or magnetism to be measured;
   (f) modulating the intensities of the phase modulated first and second beams by a wavelength-dependent, selective polarizing filter whereby the first beam is polarized into an intensity-modulated beam whereas the second beam is passed unpolarized as a non-intensity-modulated beam;
   (g) transmitting the intensity-modulated first beam and the non-intensity-modulated second beam over a second common path;
   (h) spatially separating the intensity-modulated first beam and the non-intensity-modulated second beam from each other;
   (i) sensing the intensities of the intensity-modulated first beam and the non-intensity-modulated second beam; and
   (j) computing the desired quantity by the formula:

$$D = f^{-1}(\lambda 1, \frac{I_{1o}}{I_{2o}} \cdot \frac{I_{2i}}{I_{1i}})$$

where:
   D = the quantity to be measured;
   $f^{-1}$ = an inverse function determined by the beam modulation characteristic;
   $\lambda 1$ = the wavelength of the first beam;
   $I_{1i}$ = the initial intensity of the first beam;
   $I_{2i}$ = the initial intensity of the second beam;
   $I_{1o}$ = the sensed intensity of the intensity-modulated first beam; and
   $I_{2o}$ = the sensed intensity of the non-intensity-modulated second beam.

2. The optoelectronic measuring method of claim 1, wherein the polarized first and second beams are modulated by the Pockels effect.

3. The optoelectronic measuring method of claim 1, wherein the polarized first and second beams are modulated by the Faraday effect.

4. A system for optoelectronically measuring electric quantities such as voltages, charges and current magnitudes, or magnetic quantities such as magnetic field strengths, comprising:
   (a) first and second light sources for emitting first and second beams of light of different wavelengths at a substantially predetermined ratio of intensities;
   (b) junction means for combining the first and second beams;
   (c) first optical fiber means providing a first common path for the transmission of the combined first and second beams;
   (d) a polarizer for polarizing the first and second beams received through the first optical fiber means;
   (e) an optical modulator for modulating the phases of the polarized first and second beams in accordance with a desired quantity of electricity or magnetism to be measured;
   (f) a wavelength-dependent, selective polarizing filter for polarizing only the first phase-modulated beam into an equivalent intensity-modulated beam and for passing the second phase-modulated beam as a non-intensity-modulated beam;
   (g) second optical fiber means providing a second common path for the transmission of the intensity-modulated first beam and the non-intensity-modulated second beam;
   (h) a beam splitter for spatially separating the intensity-modulated first beam and the non-intensity-modulated second beam received through the second optical fiber means;
   (i) first and second photodetectors for sensing the intensities of the separated intensity-modulated first beam and non-intensity-modulated second beam, respectively; and
   (j) means for computing the desired quantity by the formula:

$$D = f^{-1}(\lambda 1, \frac{I_{1o}}{I_{2o}} \cdot \frac{I_{2i}}{I_{1i}})$$

where:
   D = the quantity to be measured;
   $f^{-1}$ = an inverse function determined by the beam modulation characteristic;
   $\lambda 1$ = the wavelength of the first beam;
   $I_{1i}$ = the intensity of the first beam as emitted by the first light source;
   $I_{2i}$ = the intensity of the second beam as emitted by the second light source;
   $I_{1o}$ = the intensity of the intensity-modulated first beam as sensed by the first photodetector; and
   $I_{2o}$ = the intensity of the non-intensity-modulated second beam as sensed by the second photodetector.

5. The optoelectronic measuring system of claim 4, further comprising a quarter-wave plate interposed between the optical modulator and the wavelength-dependent, selective polarizing filter.

6. The optoelectronic measuring system of claim 4, wherein the first and second light sources are each a light-emitting diode.

7. The optoelectronic measuring system of claim 4, wherein the first optical fiber means comprises:
   a first length of optical fiber;
   first connector means for connecting the first length of optical fiber to the junction means; and
   second connector means for connecting the first length of optical fiber to the polarizer;
   and wherein the second optical fiber means comprises:
   a second length of optical fiber;
   third connector means for connecting the second length of optical fiber to the wavelength-dependent, selective polarizing filter; and fourth connector means for connecting the second length of optical fiber to the beam splitter.

8. The optoelectronic measuring system of claim 4, wherein the optical modulator comprises an electrooptical medium disposed on a predetermined path of the polarized first and second beams through the optical modulator whereby the beams traverse the electrooptical medium thereby to be electrooptically phase modulated in accordance with the desired quantity of electricity to be measured.

9. The optoelectronic measuring system of claim 8, wherein the optical modulator further comprises means for creating an electric field in the electrooptical medium.

10. The optoelectronic measuring system of claim 4, wherein the optical modulator comprises a magnetooptical medium disposed on a predetermined path of the polarized first and second beams through the optical modulator whereby the beams traverse the magnetooptical medium thereby to be magnetooptically phase modulated in accordance with the desired quantity of magnetism to be measured.

11. The optoelectronic measuring system of claim 10, wherein the optical modulator further comprises means for creating a magnetic field in the magnetooptical medium.

12. The optoelectronic measuring system of claim 4, wherein the wavelength-dependent, selective polarizing filter is an interference filter arranged at an angle to the path of the combined first and second beams.

13. The optoelectronic measuring system of claim 12, wherein the interference filter is so oriented that the angle between the path of the combined first and second beams and a line normal to the interference filter is from about 30° to 80°.

14. The optoelectronic measuring system of claim 12, wherein the interference filter comprises:
(a) a pane of transparent material;
(b) a plurality of layers of a first dielectric; and
(c) a plurality of layers of a second dielectric having a refractive index different from that of the first dielectric;
(d) the layers of the first and second dielectrics being alternately stacked on the pane of transparent material.

15. The optoelectronic measuring system of claim 14, wherein the first and second dielectrics are silicon dioxide and titanium dioxide.

16. The optoelectronic measuring system of claim 4 wherein the computing means comprises an arithmetic unit.

17. The optoelectronic measuring system of claim 16, further comprising a display device for visual representation of the results of computation by the arithmetic unit.

* * * * *

UNITED STATES PATENT AND TRADEMARK OFFICE
CERTIFICATE OF CORRECTION

PATENT NO. : 4,531,092
DATED : July 23, 1985
INVENTOR(S) : Fumehiko Shibano

It is certified that error appears in the above-identified patent and that said Letters Patent is hereby corrected as shown below:

Column 7, line 60 (Equation 3) delete "$1_i$" and substitute --$I_i$--.

Column 10, line 30, delete "0.02" and substitute --0.2--.

Signed and Sealed this

Fifth Day of November 1985

[SEAL]

Attest:

Attesting Officer

DONALD J. QUIGG

Commissioner of Patents and Trademarks